United States Patent [19]
Wakamatsu et al.

[11] Patent Number: 5,612,512
[45] Date of Patent: Mar. 18, 1997

[54] HIGH FREQUENCY ELECTRONIC COMPONENT HAVING BASE SUBSTRATE FORMED OF BISMALEIMIDE-TRIAZINE RESIN AND RESISTANT FILM FORMED ON BASE SUBSTRATE

[75] Inventors: Hiroki Wakamatsu, Kanazawa; Hajime Suemasa, Ishikawa-ken, both of Japan

[73] Assignee: Murata Manufacturing Co., Ltd., Japan

[21] Appl. No.: 150,601

[22] Filed: Nov. 10, 1993

[30] Foreign Application Priority Data

| Nov. 11, 1992 | [JP] | Japan | 4-327453 |
| Jan. 20, 1993 | [JP] | Japan | 5-004644 U |
| Mar. 10, 1993 | [JP] | Japan | 5-016276 U |
| Mar. 10, 1993 | [JP] | Japan | 5-016277 U |

[51] Int. Cl.$^6$ ............................................. H05K 1/02
[52] U.S. Cl. ........................ 174/260; 174/257; 174/258; 361/767; 361/771
[58] Field of Search ................................. 174/258, 257, 174/260, 261, 250; 361/767, 771

[56] References Cited

U.S. PATENT DOCUMENTS

| 4,081,601 | 3/1978 | Dinella et al. | 174/68.5 |
| 5,237,130 | 8/1993 | Kulesza et al. | 174/260 |
| 5,266,748 | 11/1993 | Kawakami et al. | 174/262 |
| 5,346,857 | 9/1994 | Scharr et al. | 437/183 |
| 5,402,314 | 3/1995 | Amago et al. | 361/760 |
| 5,406,459 | 4/1995 | Tsukamoto et al. | 361/768 |

*Primary Examiner*—Laura Thomas
*Attorney, Agent, or Firm*—Ostrolenk, Faber, Gerb & Soffen, LLP

[57] ABSTRACT

A high-frequency electronic component includes: a base substrate and a high-frequency electronic component element which is mounted on one face of the base substrate by soldering. The base substrate is made of bismaleimide-triazine resin.

3 Claims, 13 Drawing Sheets

Fig. 2(a) PRIOR ART
Fig. 2(d) PRIOR ART
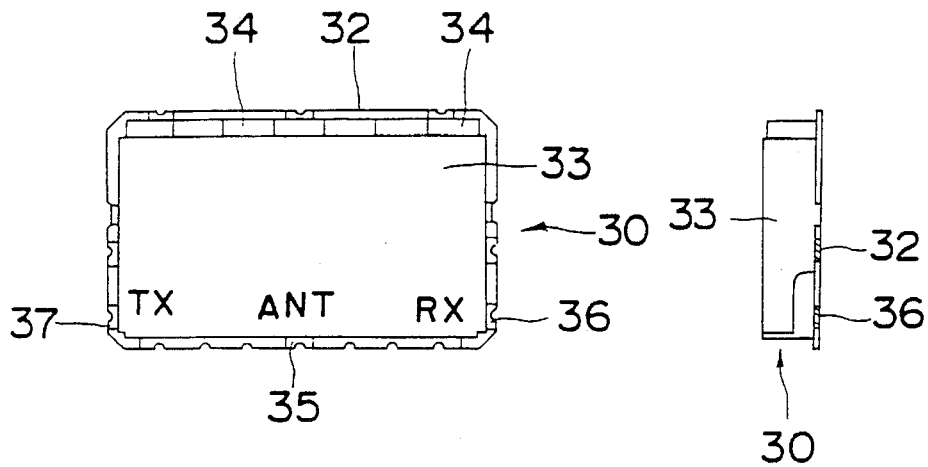
Fig. 2(b) PRIOR ART
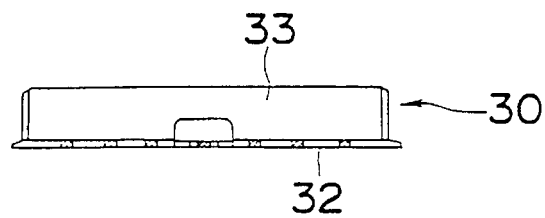
Fig. 2(c) PRIOR ART
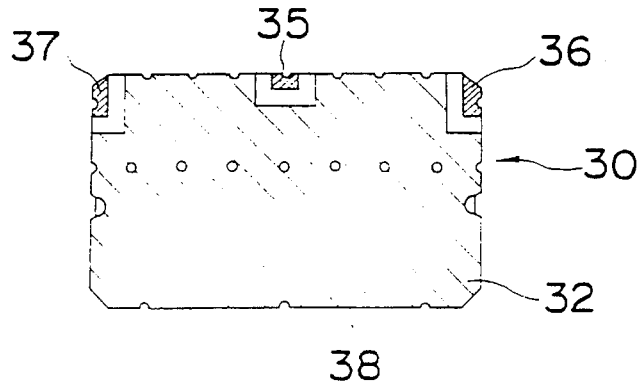

Fig. 10
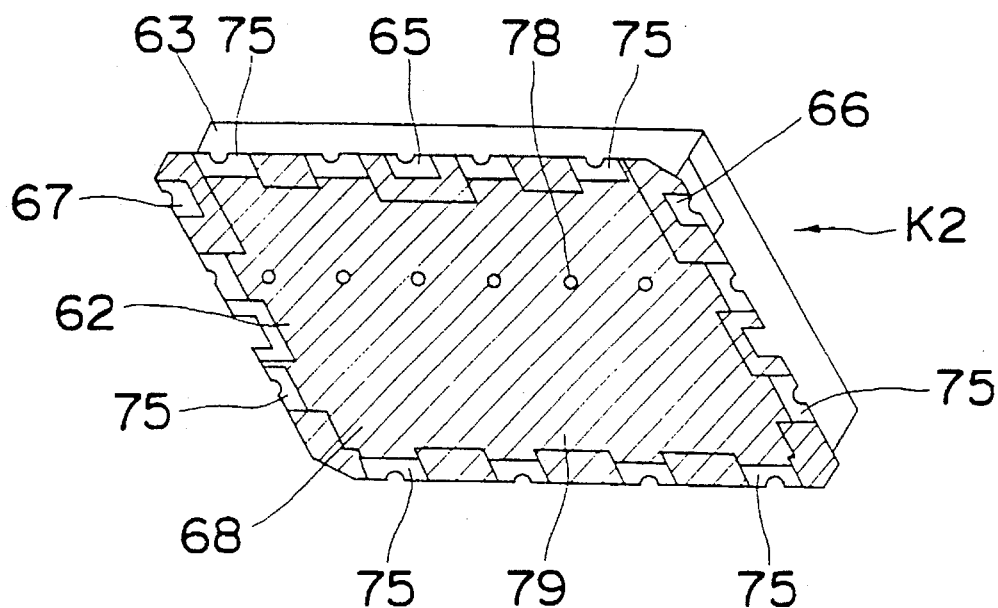
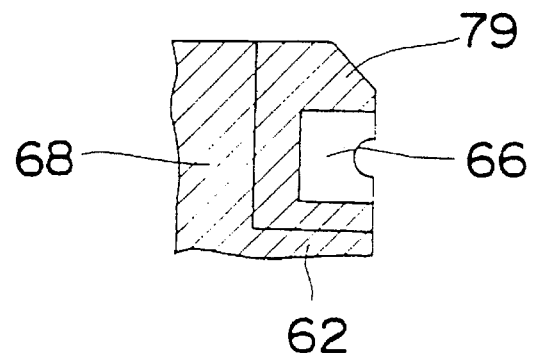
Fig. 11(a)
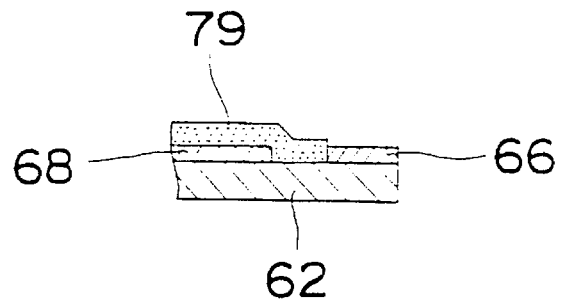
Fig. 11(b)

HIGH FREQUENCY ELECTRONIC COMPONENT HAVING BASE SUBSTRATE FORMED OF BISMALEIMIDE-TRIAZINE RESIN AND RESISTANT FILM FORMED ON BASE SUBSTRATE

BACKGROUND OF THE INVENTION

In one aspect of the present invention, the present invention relates to a dielectric filter for use in mobile communication devices such as an automobile telephone, a portable telephone, etc.

FIG. 1 shows a known dielectric filter. The known dielectric filter is a duplexer type includes a band-elimination filter and a band-pass filter so that the dielectric filter functions also as an antenna coupling circuit device. In FIG. 1, a base substrate 22 is made of dielectric material such as glass-epoxy, Teflon glass or the like and input/output terminals 23, 24 and 25 are formed as electrode films, on an upper surface of the base substrate 22 to be connected to an antenna, a transmitter and a receiver, respectively. An earth electrode 26 is formed as an electrode film on the remaining portion of the upper surface of the base electrode 22 excluding the input/output terminals 23–25 and a lower surface of the base electrode 22. Various electronic components such as seven dielectric coaxial resonators 1–71 are mounted on an upper surface of the earth electrode 26 by soldering, etc. A connection terminal 9 is press fitted into each of holes 8 of the dielectric coaxial resonators 1–7. Furthermore, coupling substrates 13 and 18, spacers 21, a metal cover 27, capacitor substrates, inductors, etc. are mounted on the base substrate 22. A casing of the known dielectric filter is constituted by the metal cover 27 and the base substrate 22.

Because the base substrate 22 is made of glass-epoxy or Teflon glass, the base substrate 22 of the known dielectric filter has the following drawbacks. Namely, the dielectric filter 22 made of glass-epoxy has low heat resistance, a poor temperature coefficient and a poor dielectric loss tangent $\delta$. Also, the dielectric filter 22 made of Teflon glass is disadvantageous in that its dielectric constant $\epsilon r$ is excessively low, its production cost is high because of the need for surface treatment for processing of the through-hole and the material is expensive.

To, obtain the input/output terminals 23–25 and the earth electrode 26 in the known dielectric filter, a copper foil is formed and is subjected, on its surface, to a solder leveller treatment in which air is blown at one side of the base substrate 22 which is dipped in molten solder so as to increase the flatness of the input/output terminals 23–25 and the earth electrode 26.

Thus, in production of the base substrate 22 of the known dielectric filter, because the solder leveller treatment is performed as described above, protuberances of solder are likely to be produced at the time of blowing of air, thereby resulting in nonuniform soldering. In this case, warpage of the base substrate 22 is caused by a difference in shrinkage of solder on the upper and lower surface of the base substrate 22. In addition, the protuberances of solder deteriorate flatness of the base substrate 22.

Furthermore, in the solder leveller treatment, because the base substrate 22, made of for example glass-epoxy, has already been subjected to heat once during its production, stress is generated by the difference in coefficient of thermal expansion of the glass-epoxy, the copper foil and solder, so that warpage or distortion of the base substrate 22 may occur at the time of its delivery to customers. If the customers use the base substrate 22 without noticing such defects of the base substrate 22, the soldering land maybe spaced away from the copper foil whereby soldering cannot be performed because of reflow soldering. Consequently, it is impossible to mount the dielectric coaxially resonators 1–7 on the earth electrode 22.

FIGS. 2(a) to 2(d) show another known dielectric filter 30. A casing of the known dielectric filter 30 is constituted by a base 32 formed by a dielectric substrate and a metal cover 33 for covering an upper surface of the base 32. The base 32 is formed by a flat plate and a plurality of dielectric resonators 34 are mounted on an upper surface of the base 32. Other electronic components such as a chip capacitor, a coiled inductance, etc. are further mounted on the upper surface of the base 32. The cover 33 is mounted on the upper surface of the base 32 to cover these electronic components.

As shown in FIG. 2(c), input/output terminals 35, 36 and 37 which are each formed by an electrode film are provided on a lower surface of the base 32 to be connected to an antenna, a receiver and a transmitter, respectively. An earth electrode 38 which is formed by an electrode film is formed at the remaining portion of the lower surface of the base 32 other than the input/output terminals 35 and 37. The input/output terminals 35–37 and the earth electrode 38 are each connected to an electrode film formed on the upper surface of the base 32 through semicircular through-holes formed at an edge of the base 32.

As shown in FIG. 3, the dielectric filter 30 is a surface mounting type in which the dielectric filter 30 is mounted on an upper surface of a printed circuit board 39 at the side of a producer of communication equipment. When the dielectric filter 30 is secured to the printed circuit board 39 by soldering, the following method has been employed. It should be noted that in FIG. 3, the dielectric filter 30 is depicted to be larger than that of the printed circuit board 39 for the sake of convenience. Namely, as shown in FIG. 3, an earth electrode 40 is formed at a portion of a hot surface of the printed circuit board 39, at area other than patterns to define an area soldered to the earth electrode 38 of the base 32 of the dielectric filter 30. Namely, as shown by hatching of the printed circuit board 39 of FIG. 3, a resist film 41 is formed on the entire surface of the earth electrode 40 except for rectangular portions 42 which form a soldering area for soldering the input/output terminals 35–37 and the earth electrode 38 of the base 32.

As shown in FIG. 4, the following problems arise at the time of mounting the dielectric filter 30 at the side of a producer of communication equipment. FIG. 4 shows soldering between the input/output terminal 36 of the base 32 and a pattern 43 of the hot surface of the printed circuit board 39. As shown in FIG. 4, when the input/output terminal 36 and the pattern 43 have been soldered to each other by solder 44, the solder 44 flows between the dielectric filter 30 and the resist film 41 of the printed circuit board 39 so as to reach the earth electrode 38. As a result, shortcircuiting happens between the earth electrode 38 and the input/output electrode 36 of the base 32 or the pattern 43 of the printed circuit board 39.

When a hot line is provided on the lower surface of the dielectric filter 30 in design of the printed circuit board 39 at the side of a producer of communication equipment, shortcircuiting may take place with an undesirable reduction in the degree of freedom.

Furthermore, in case a portion of the earth electrode 38 of the base 32 acts as an earth electrode 45 and the earth electrode 45 is soldered to the earth electrode 40 of the printed circuit board 39 as shown in FIG. 5, the following problem results. Specifically, solder 44 for soldering the earth electrode 45 proceeds on the surface of the earth electrode 38 of the base 32 of the dielectric filter 30 so as to reach an inner portion of the lower surface of the dielectric filter 30. Hence, shortcircuiting may occur between the earth electrode 38 of the dielectric filter 30 and an electrode 47 formed on a peripheral surface of a through-hole 46 of the printed circuit board 39 at the side of a producer of communication equipment. Solder 44 passes through the through-hole 46 of the printed circuit board 39 and flows to a lower surface of the printed circuit board 39, thereby resulting in shortcircuiting between the earth electrode 38 and components on the lower surface of the printed circuit board 39.

In another aspect of the present invention, the present invention relates to a method of soldering electronic components and more particularly, to a method of preventing a so-called resorption phenomenon in which metals of the electronic components dissolve into solder at the time of soldering.

Conventionally, an alloy of Pb and Sn has been employed as solder for soldering electronic components. When soldering is performed by using the known solder alloy referred to above, it is known that resorption happens. Thus, metals used for the electronic components dissolve into molten solder. Almost all kinds of metals dissolve into solder.

Meanwhile, the metals which have dissolved into solder by resorption are deposited as a compound with Pb or Sn. Because the deposited compound is quite fragile, mechanical strength of solder containing the compound is extremely small. Furthermore, because the compound is likely to be formed at a boundary between base metal and solder, soldered portions become weak and unable to withstand against vibrations or bending causing the soldered portions to be peeled from the boundary face. Therefore, the electronic component in which soldering is performed in the known method has such drawbacks that mechanical strength of the soldered portions is reduced and its electrical characteristics deteriorate.

SUMMARY OF THE INVENTION

Accordingly, an essential object of the present invention is to provide, with a view to eliminating the disadvantages inherent in conventional high-frequency electronic components, a high-frequency electronic component which has excellent characteristics and high reliability.

A further object of the present invention is to provide a high-frequency electronic component having an electrode construction in which warpage and distortion of a base substrate are lessened and mounting reliability is increased.

A further object of the present invention is to provide a dielectric filter wherein when the dielectric filter is mounted on a printed circuit board at the side of a producer of communication equipment by soldering, risk of shortcircuiting is reduced and the degree of freedom in design of the producer's printed circuit board is increased.

Another object of the present invention is to provide a soldering method in which resorption of metals by solder is prevented.

In order to accomplish these objects of the present invention, a high-frequency electronic component according to one embodiment of one aspect of the present invention includes a base substrate and a high-frequency electronic component element which is mounted on one surface of the base substrate by soldering, etc., the base substrate being made of bismaleimide-triazine resin.

A modified high-frequency electronic component includes a base substrate which acts also as a casing of the electronic component and is formed, on its one surface, with an electrode such that an electronic component element is mounted on the electrode; wherein nickel ground is formed at a portion of the base substrate, acting as the electrode and electroless gold plating is performed on a surface of the nickel ground.

A dielectric filter according to a further embodiment of the present invention includes a base which includes a circuit component mounted on its upper surface, an input/output terminal and an earth terminal so as to be mounted on a printed circuit board; the input/output terminal and the earth terminal being provided at predetermined locations of a peripheral edge on a lower surface of the base so as to be connected, by soldering, to terminals formed on the printed circuit board, respectively; wherein a resist film is formed at substantially the whole of the lower surface of the base except the input/output terminal and the earth terminal.

When soldering in electronic component to an object such as a base is performed in a soldering method according to one embodiment of another aspect of the present invention, solder containing a metal identical to that used for the electronic component is used.

In accordance with the one embodiment of the one aspect the present invention, because bismaleimide-triazine resin is more heat resistant than glass-epoxy and excellent in stability of temperature characteristics, changes in outer appearance and characteristics before and after reflow soldering are minimal. Furthermore, because bismaleimide-triazine resin an excellent dielectric loss tangent δ, a product having superior characteristics can be obtained. Because bismaleimide-triazine resin has a proper dielectric constant εr in comparison with Teflon, a capacity pattern can be reduced in size thereby resulting in a compact product. In addition, because bismaleimide-triazine resin is inexpensive, a product which not only has excellent characteristics but is inexpensive and highly reliable can be obtained without increasing the production cost.

In accordance with the further embodiment of the present invention, warpage and distortion of the base substrate can be lessened and thus, a product having high mounting stability can be obtained. Also, because gold plating is performed, changes in the base substrate with time can be eliminated and excellent soldering can be performed at all times.

In accordance with the further embodiment of the present invention, when a dielectric filter is soldered to the printed circuit board at the side of a producer of communication equipment, flow of solder along the resist film is prevented and thus, risk of shortcircuiting between the hot terminals such as the input/output terminal and the earth electrode can be substantially eliminated. Because the mounting surface of the dielectric filter is substantially occupied by an insulating area formed by the resist film, risk of shortcircuiting between the earth electrode and the hot line can be eliminated, so that the degree of freedom in design of the printed circuit board at the side of a producer of communication equipment can be increased.

In accordance with the one embodiment of another aspect of the present invention, soldering to the electronic component is performed by using solder containing a metal used for the electronic component. As a result, a portion of the metal used for the electronic component, which is molten into the solder, is reduced in quantity.

BRIEF DESCRIPTION OF THE DRAWINGS

These objects and features of the present invention will become apparent from the following description taken in conjunction with the preferred embodiments thereof with reference to the accompanying drawings, in which:

FIGS. 2(a), 2(b), 2(c) and 2(d) are a top plan view, a front elevational view, a bottom plan view and a side elevational view of another prior art dielectric filter, respectively (already referred to);

FIG. 10 is a perspective view of a dielectric filter according to a second embodiment of the present invention as observed from its mounting face;

FIG. 11(a) and FIG. 11(b) are an enlarged fragmentary top plan view and an enlarged fragmentary sectional view of an input/output terminal portion of the dielectric filter of FIG. 10, respectively;

Before the description of the present invention proceeds, it is to be noted that like parts are designated by like reference numerals throughout several views of the accompanying drawings.

DETAILED DESCRIPTION OF THE INVENTION

Figure 1:
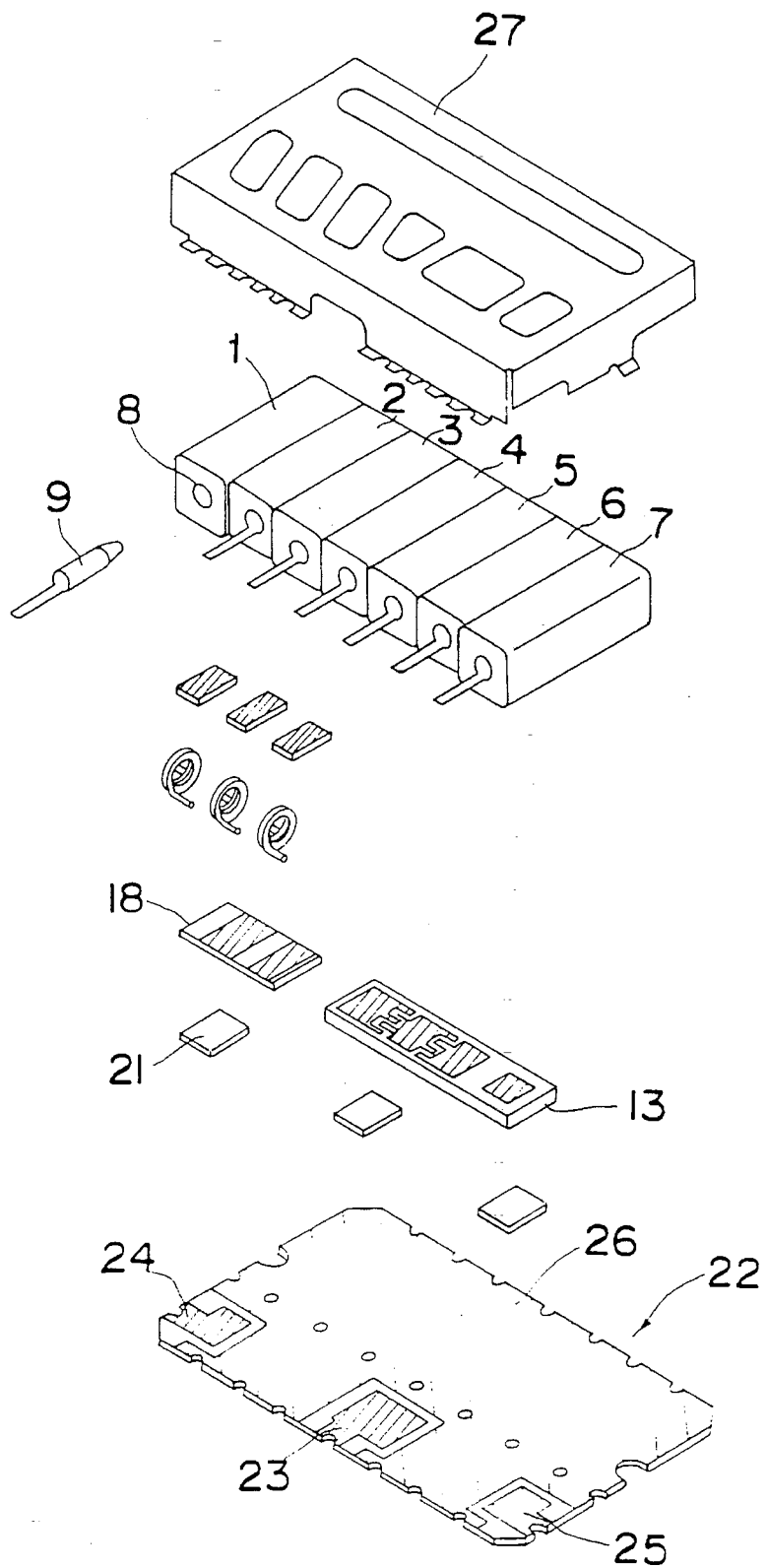
FIG. 1 is an exploded perspective view of a prior art dielectric filter (already referred to)
Figure 3:
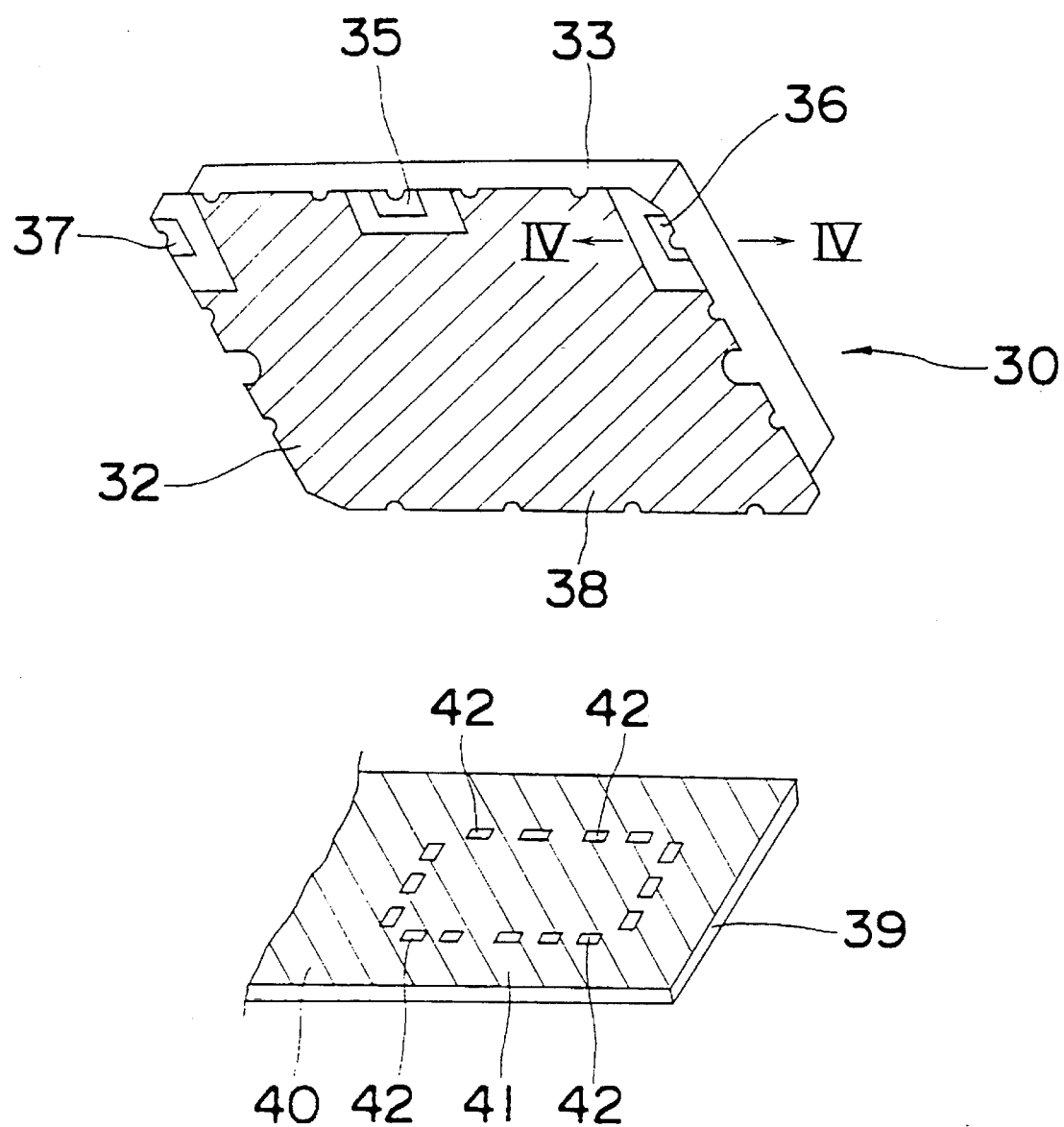
FIG. 3 is a perspective view of the prior art dielectric filter of FIGS. 2(a) to 2(d) and a printed circuit board (already referred to)
Figure 4:
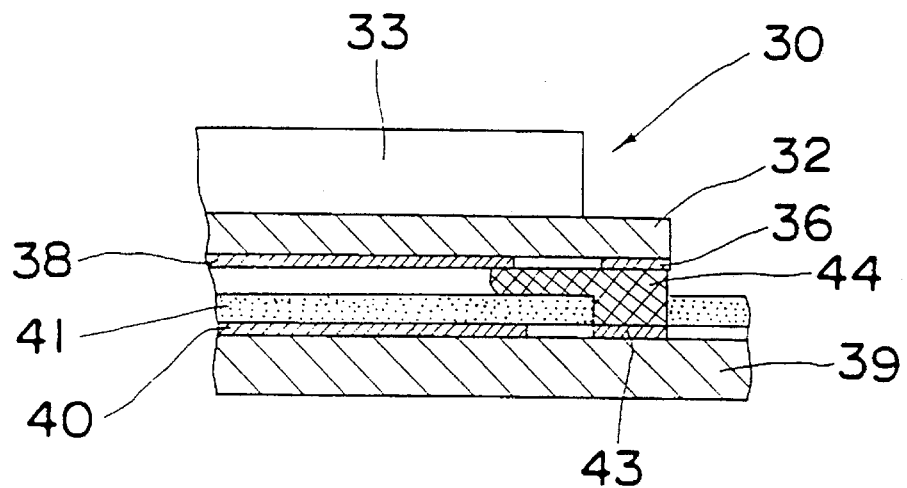
FIG. 4 is a sectional view taken along the line IV—IV in FIG. 3 (already referred to)
Figure 5:
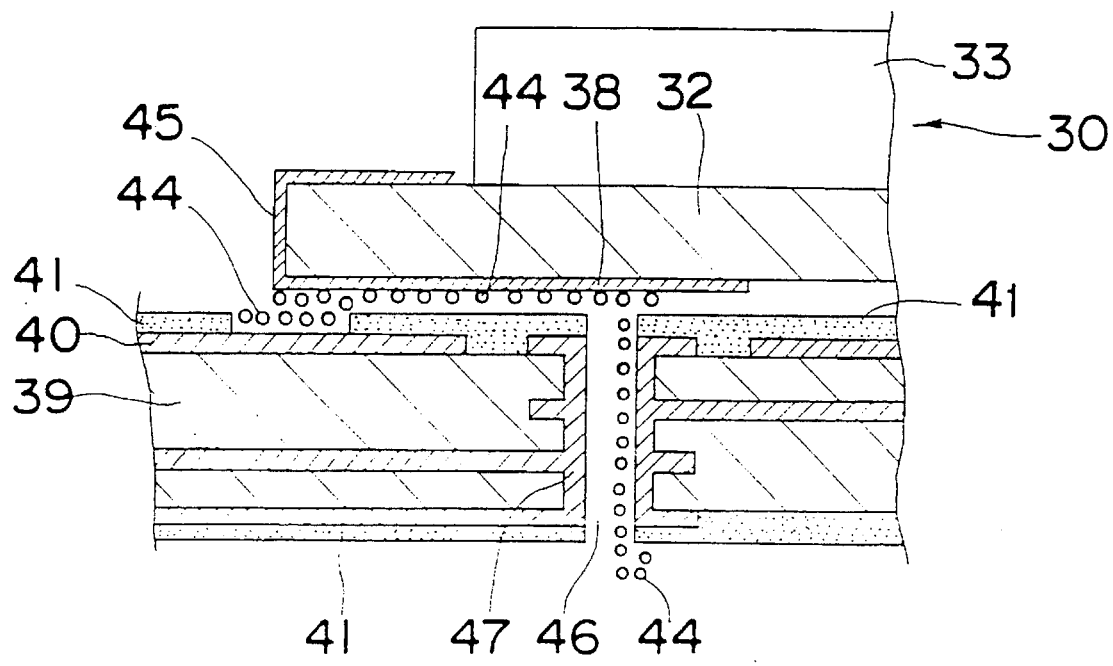
FIG. 5 is a sectional view showing soldering between the prior art dielectric filter and the printed circuit board of FIG. 3 (already referred to)
Figure 6:
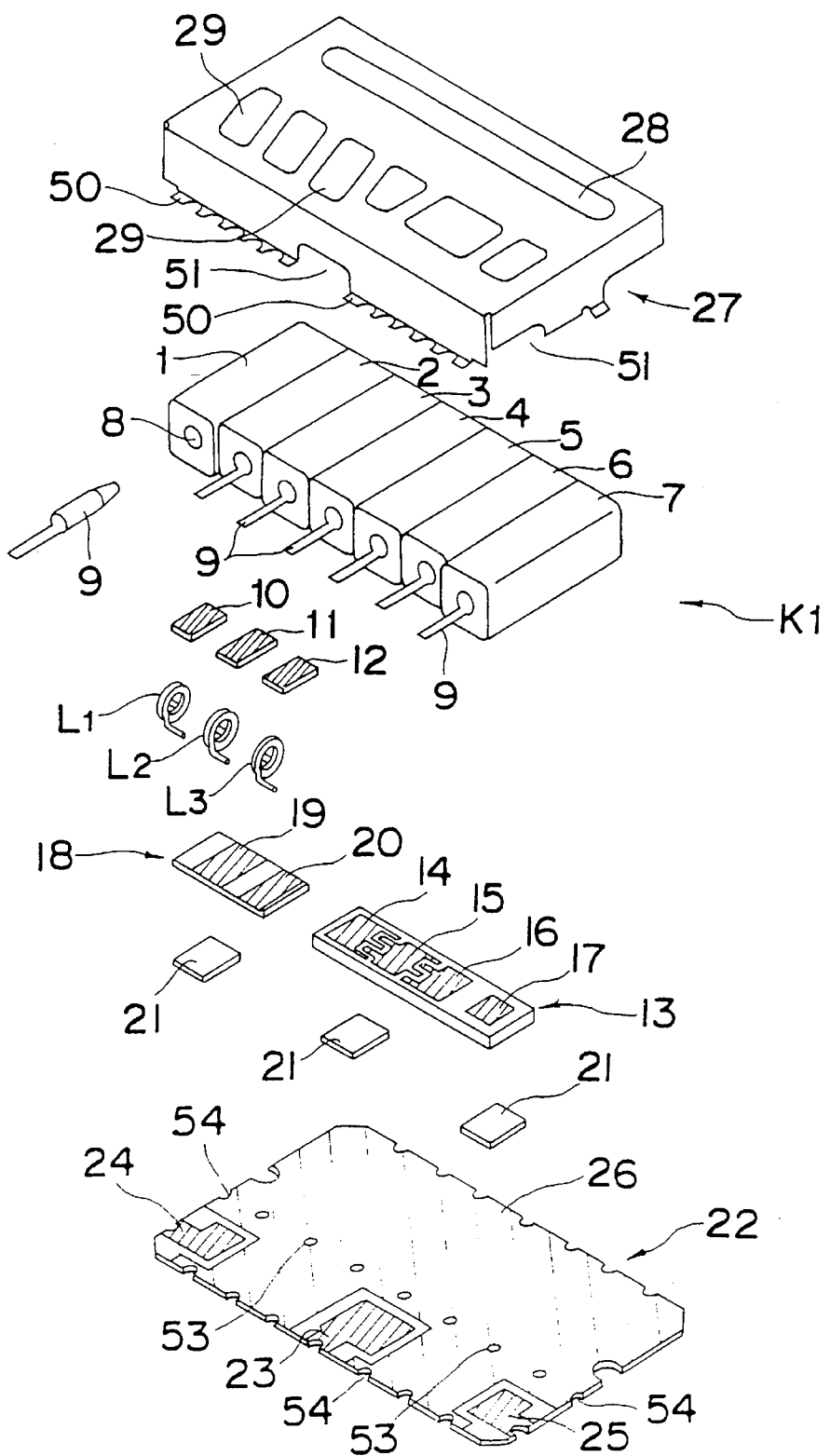
FIG. 6 is an exploded perspective view of a dielectric filter according to a first embodiment of one aspect of the present invention.
Figure 7:
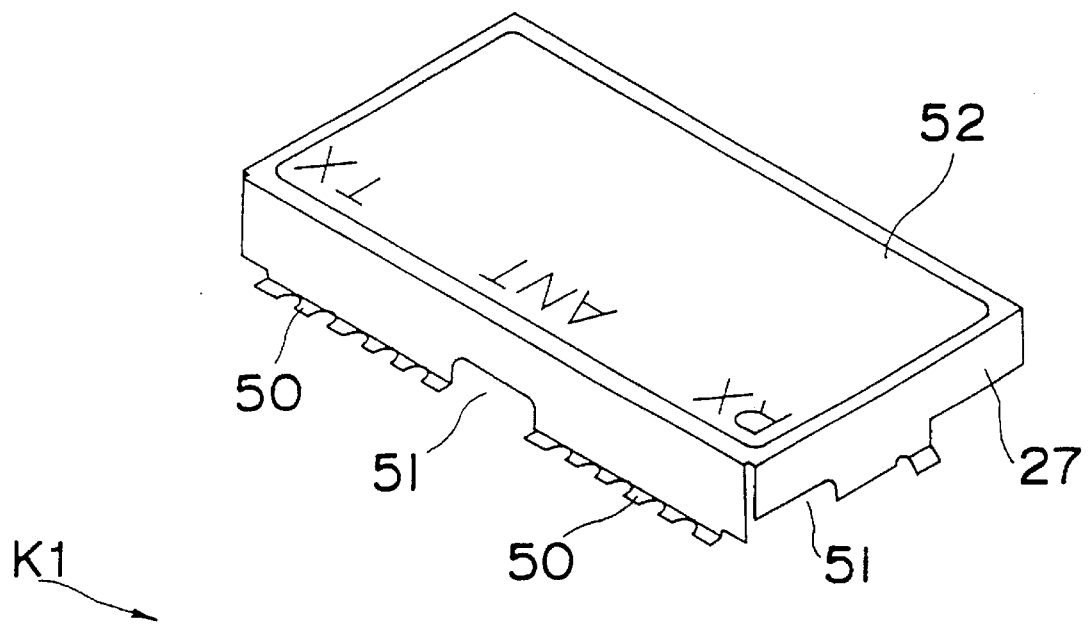
FIG. 7 is a view showing a mounting state of the dielectric filter of FIG. 6.
Figure 7:
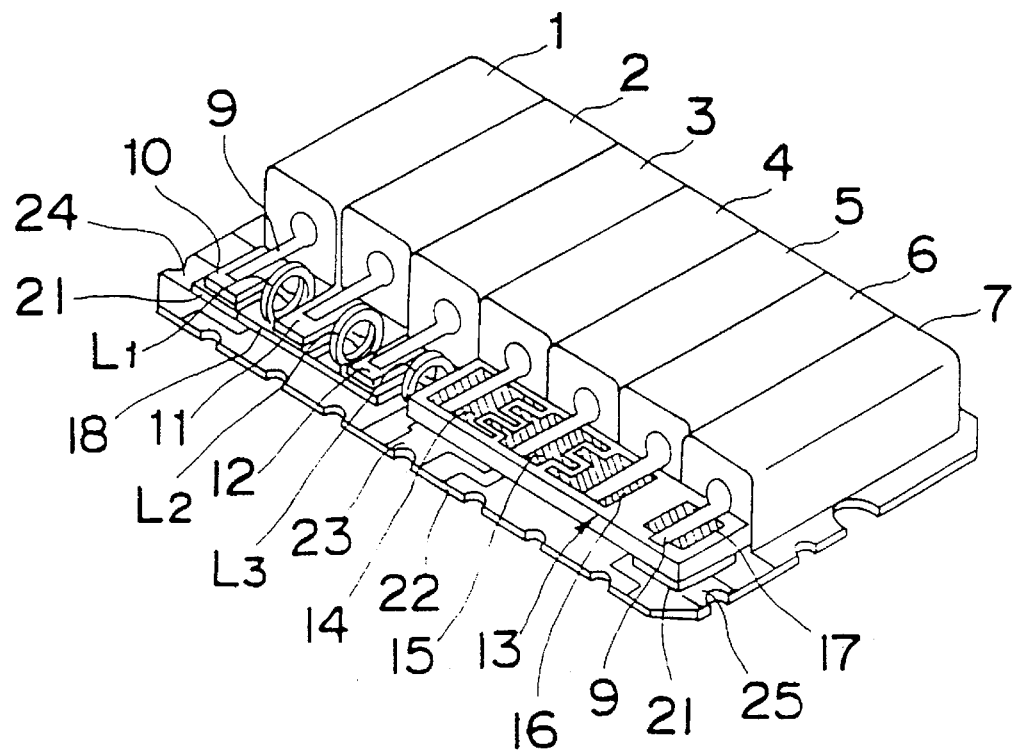

Referring now to the drawings, there is shown in FIGS. 6 and 7, a dielectric filter K1 according to a first embodiment of one aspect of the present invention. The dielectric filter K1 is used for mobile communication devices such as an automobile telephone, a portable phone, etc. and is used in a microwave band so as to be a so-called antenna duplexer. The dielectric filter K1 is constituted by a band elimination filter at the side of a transmitter and a band-pass filter at the side of a receiver. A whole construction of the dielectric filter K1 of the surface mounting type is described with reference to FIGS. 6 and 7. The band elimination filter is formed by a three-stage resonator and includes three quarter-wavelength type dielectric coaxial resonators 1–3. On the other hand, the band-pass filter is formed by a four-stage resonator and includes four quarter-wavelength dielectric coaxial resonators 4–7. Each of the dielectric coaxial resonators 1–7 is constituted by an inner conductor formed in an electrode film on a peripheral surface of a hole 8 of a dielectric having a shape of rectangular parallelopiped, an outer conductor formed in an electrode film on side surface of the dielectric and a shortcircuiting conductor (not shown) for connecting the inner and outer conductors. The shortcircuiting conductor is formed in an electrode film on one the opposite edge surfaces of the dielectric, into which the hole 8 opens such that each of the dielectric coaxial resonators 1–7 resonates at a predetermined frequency. A metallic connecting terminal 9 having one substantially cylindrical end is press fitted into an open end of the hole 8 of each of the dielectric coaxial resonators 1–7 and is brought into contact with the inner electrode in the hole 8 so as to be electrically connected to the inner electrode. The other end of the connecting terminal 9 is formed in the a shape of a tongue so as to be connected, by soldering, to capacitor substrates 10–12 and electrode films 14–17 formed on an upper face of a coupling substrate 13.

Each of the capacitor substrates 10–12 is made of dielectric and electrode films formed on upper and lower surfaces of each of the capacitor substrates 10–12 such that each of the capacitor substrates 10–12 acts as a capacitor. The coupling substrate 13 is made of dielectric and a plurality of the electrode films 14–17 are formed side by side on the upper surface of the coupling substrate 13. To increase the coupling capacity of the electrode films 14–16, each of opposed portions of the electrode films 14–16 is formed with interlocking teeth shapes Furthermore, electrode films are formed at opposite sides on a lower surface of the coupling substrate 13. coiled inductors L1–L3 are connected to the; capacitor substrates 10–12. Electrode films 19 and 20 are formed on an upper surface of a coupling substrate 18 made of dielectric such that the inductors L1–L3 are mounted on the upper surface of the coupling substrate 18, while an electrode film acting as an earth electrode is formed on a whole lower surface of the coupling substrate 18.

The above mentioned members are mounted on an upper surface of a base substrate 22. Input/output terminals 23, 24 and 25 which are each formed by an electrode film are provided on the upper surface of the base substrate 22 so as to be connected to an antenna, a transmitter and a receiver, respectively. The base substrate 22 is made of dielectric or insulating material. The coupling substrate 13 is mounted on the upper surface of the base substrate 22 through two spacers 21, while another spacer 21 is mounted on an upper surface of the input/output terminal 24 of the base substrate 22. These three spacers 21 are made of electrically conductive material such as metal.

Figure 9A:
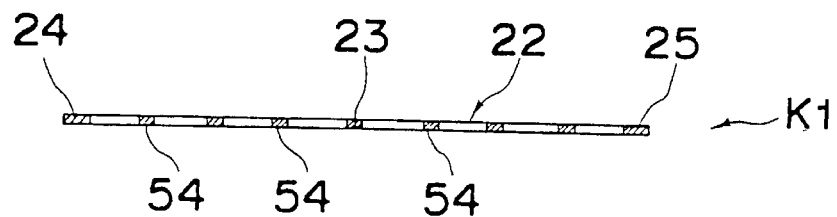
FIGS. 9(a) and 9(b) are a side elevational view and a rear elevational view of a base substrate employed in the dielectric filter of FIG. 6, respectively.
Figure 9B:
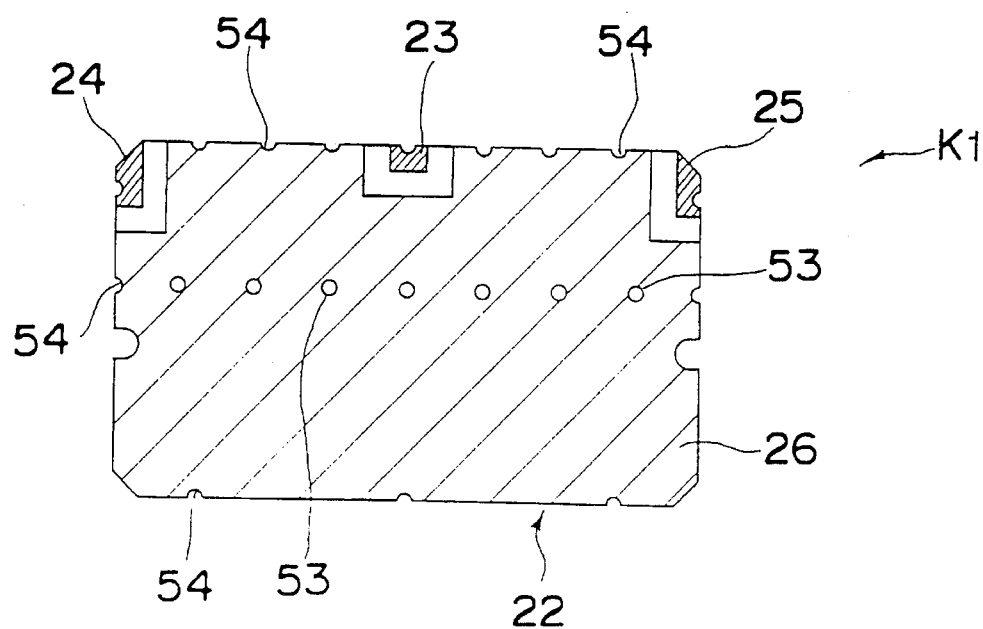

As shown in FIGS. 6 and 9(b), filmy earth electrodes 26 are formed on the entire upper and lower surfaces of the base substrate 22 except for areas where the input/output terminals 23–25. The earth electrodes 26 formed on the upper and lower surfaces of the base substrate 22, respectively, are electrically connected to each other by a plurality of through-holes 53 arranged linearly along the length of the substrate 22. In addition, the earth electrodes 26 on the upper and lower surfaces of the base substrate 22 are electrically connected to each other by electrode films formed on edge surfaces of a plurality of semicircular recesses 54 provided on an outer periphery of the base substrate 22. Furthermore, the input/output terminals 23–25 on the upper and lower surfaces of the base substrate 22 are also electrically connected to each other by electrode films formed on edge surfaces of the base substrate 22.

A cover 27 for covering the base substrate 22 is made of metal. An elongated opening 28 for soldering the cover 27 to the outer conductors on the upper surfaces of the dielectric coaxial resonators 1–7, etc. and a plurality of openings 29 for inserting a jig for adjusting characteristics of the dielectric coaxial resonators 1–7 are formed on a top plate of the cover 27. A plurality of earth electrodes 50 are formed at front and rear lower edges of the cover 27 so as to be connected to the earth electrode 26 on the upper surface of the base substrate 22. Three recesses 51 are formed on a side plate of the cover 27 so as to expose the input/output terminals 23–25 of the base substrate 22. As shown in FIG. 7, a label 52 is bonded to the upper surface of the cover 27 so as to cover the elongated opening 28 and the openings 29.

Although the cover 27 is used in this embodiment, it does not have to be. The label 52 is made of resin "Kapton" (brand name of Du Pont) which has high heat resistance. When the label 52 is made of resin, the label 52 does not have a shielding function. Thus, when the label 52 should have shielding function, the label 52 is made of metal.

Arrangement of the members of the dielectric filter K1 will now be described. At the side of the band elimination filter, the single spacer 21 is mounted on the input/output terminal 24 of the base substrate 22 and the coupling substrate 18 is mounted on the earth electrode 26 between the input/output terminals 24 and 23 of the base substrate 22 by soldering as shown in FIGS. 6 and 7. Furthermore, the two spacers 21 are, respectively, mounted on the input/output terminals 23 and 25 and the coupling substrate 13 is bridged between the spacers 21 by soldering such that the electrode film on the lower surface of the coupling substrate 13 is brought into contact with the upper surfaces of the spacers 21.

As shown in FIG. 7, one end of the inductor L1 is mounted on the upper surface of the spacer 21 and the capacitor substrate 10 is mounted on the one end of the inductor L1. The connecting terminal 9 from the dielectric coaxial resonator 1 is connected to the electrode film on the upper surface of the capacitor substrate 10. The other end of the inductor L1 is mounted on the electrode film 19 of the coupling substrate 18 and the inductor L2 is mounted between the electrode films 19 and 20 of the coupling substrate 18. The capacitor substrate 11 is mounted on connecting portions of the inductors L1 and L2 and the connecting terminal 9 from the dielectric coaxial resonator 2 is connected to the electrode film on the upper surface of the capacitor substrate 11. One end of the inductor L3 is mounted on the electrode film 20 of the coupling substrate 18, while the other end of the inductor L3 is mounted on the input/output terminal 23. The capacitor substrate 12 is mounted on connecting portions of the inductors L2 and L3 and the connecting terminal 9 from the dielectric coaxial resonator 3 is connected to the electrode film on the upper surface of the capacitor substrate 12. The connecting terminals 9 from the dielectric coaxial substrates 4–7 are, respectively, connected to the electrode films 14–17 on the upper surface of the coupling substrate 13 mounted on the two spacers 21.

Figure 8:
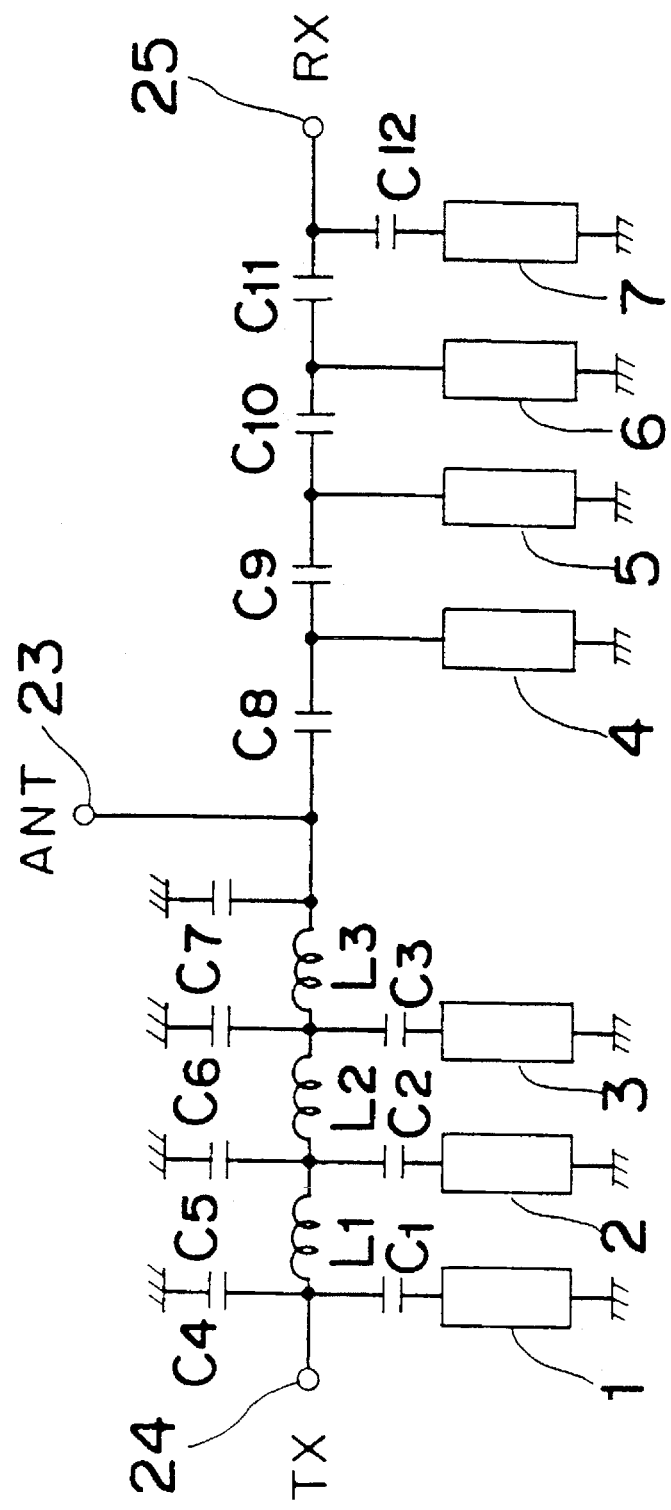
FIG. 8 is an equivalent circuit diagram of the dielectric filter of FIG. 6.

FIG. 8 shows an equivalent circuit of the dielectric filter K1 of the above described arrangement. Capacitors C1–C3 at the side of the band elimination filter are formed by the upper and lower electrode films of the capacitor substrates 10–12. A capacitor C4 is formed between the input/output terminal 24 and the earth electrode 26 on the lower surface of the base substrate 22. Capacitors C5 and C6 are formed by the electrode films 19 and 20 on the upper surface of the coupling substrate 18 and the electrode films on the lower surface of the coupling substrate 18. A capacitor C7 is formed between the input/output terminal 23 and the earth electrode on the lower surface of the base substrate 22.

On the other hand, at the side of the band-pass filter, a capacitor C8 is formed between the electrode film 14 of the coupling substrate 13 and the electrode film on the lower surface of the coupling substrate 13, while capacitors C9 and C10 are formed among the electrode films 14 to 16 of the coupling substrate 13. A capacitor C11 is formed by the electrode film 16 on the upper surface of the coupling substrate 13 and the electrode film on the lower surface of the coupling substrate 13. This electrode film on the lower surface of the coupling substrate 13 is electrically connected to the spacer 21 disposed at the right end of FIG. 6. Furthermore, a capacitor C12 is formed by the electrode film 17 on the upper surface of the coupling substrate 13 and the electrode film on the lower surface of the coupling substrate 13. A trap circuit of a series resonance circuit is constituted by the dielectric coaxial resonator 7 and the capacitor C12.

The present invention is characterized in that the base substrate 22 is made of bismaleimide-triazine resin which is commercially available from, for example, Mitsubishi Gas Chemical Co., Inc. of Japan. Because bismaleimide-triazine resin has better heat resistance than hitherto employed glass-epoxy and thus, has stable temperature characteristics, changes in outer appearance and characteristics before and after reflow soldering are minimal. Furthermore, because the dielectric loss tangent $\delta$ is excellent, a product having superior characteristics can be obtained.

Also, because bismaleimide-triazine resin has a more desirable dielectric constant $\epsilon r$ than that of Teflon glass, a capacity pattern can be reduced in size thereby resulting in a compact product. Furthermore, bismaleimide-triazine resin is inexpensive and has lower water absorption than glass-epoxy and Teflon glass.

Furthermore, bismaleimide-triazine resin has such features that (1) the dielectric constant and dielectric loss tangent $\delta$ are small as compared with those of other thermosetting resins, (2) heat resistance is excellent in view of its glass transition temperature of 255° to 330° C., (3) migration through displacement of copper ions is likely to happen because of its excellent electrical insulating property, (4) mechanical characteristics are excellent, (5) chemical resistance is excellent, (6) curing can be performed at relatively low temperature and (6) toxicity, skin irritation and the accumulative property are low. Thus, the base substrate 22 is formed by a copper-clad laminate having low dielectric characteristics.

In this embodiment, the dielectric filter K1 includes a combination of the band-pass filter and the band elimination filter so as to function also as an antenna duplexer. However, the dielectric filter K1 may also be formed by one of the band-pass filter and the band elimination filter, one of high-pass filter and a low-pass filter or a combination of these filters. In the dielectric filter K1, the number of stages of the resonators is not limited.

Furthermore, in this embodiment, the dielectric filter K1 includes the base substrate on which the dielectric coaxial resonators are mounted. However, the present invention is not restricted to the dielectric filter but may also be applied to various electronic components such as a front end circuit of a VCO or FM employing the base substrate made of bismaleimide-triazine resin.

In the high-frequency electronic component in which the high-frequency electronic component elements are mounted on one surface of the base substrate by soldering, etc., according to the first embodiment of the present invention, the base substrate is made of bismaleimide-triazine resin. Because bismaleimide-triazine resin has better heat resistance and stability of temperature characteristics than glass-epoxy, changes in outer appearance and characteristics before and after reflow soldering are minimal. Because bismaleimide-triazine resin has an excellent dielectric loss tangent δ, the product has superior characteristics. Furthermore, because bismaleimide-triazine resin has a better dielectric constant than that of Teflon glass, a capacity pattern can be reduced in size and thus, the product can be made compact. In addition, because bismaleimide-triazine resin is inexpensive, the product which not only has excellent characteristics but is inexpensive and highly reliable can be obtained without increasing the production cost.

Hereinbelow, a dielectric filter K1' which is a modification of the dielectric filter K1 is described. Subject matter of the dielectric filter K1' is directed to electrode construction of the input/output terminals 23–25 and the earth electrode 26 and the dielectric filter K1' is characterized in that these electrodes are subjected to electroless gold plating of nickel ground. Namely, copper foils are initially formed at portions of the base substrate 22 corresponding to the input/output terminals 23–25 and the earth electrode 26 and then, nickel ground is formed on surfaces of the copper foils. Subsequently, electroless gold plating is performed on a surface of the nickel ground.

Because it is technically difficult to perform electroless solder plating, electroless gold plating is performed instead. Also because Au-Sn alloy produced after gold plating is fragile, the nickel ground is formed to improve the property of this Au-Sn alloy. The nickel ground has a thickness of 2 μm, while the electroless gold plating has a thickness of 0.3 μm. After electroless gold plating of nickel ground, resist is applied to the portions of the earth electrode 26 other than those subjected to soldering.

In the base substrate of the modified dielectric filter K1', which acts also as the casing of the dielectric filter K1' and is formed, on one surface with the electrodes such that the electronic component elements are mounted on the electrodes, nickel ground is formed at portions of the base substrate other than the electrodes and electroless gold plating is performed on a surface of the nickel ground.

Thus, in the dielectric filter K1', because warpage and distortion of the base substrate can be lessened, the dielectric filter K1' has high mounting reliability. Furthermore, in the dielectric filter K1', because gold plating is performed on the base substrate, changes of the dielectric filter K1' with time are minimized and excellent soldering can be performed at all times.

FIG. 10 shows a dielectric filter K2 according to a second embodiment of the present invention. The dielectric filter K2 includes a base 62 formed by a dielectric substrate and a boxlike metallic cover 63 opening on its lower surface. Electronic component elements such as dielectric resonators, etc. are mounted on an upper surface of the base 62, while the lower face of the cover 63 is soldered to the upper surface of the base 62.

Figure 13:
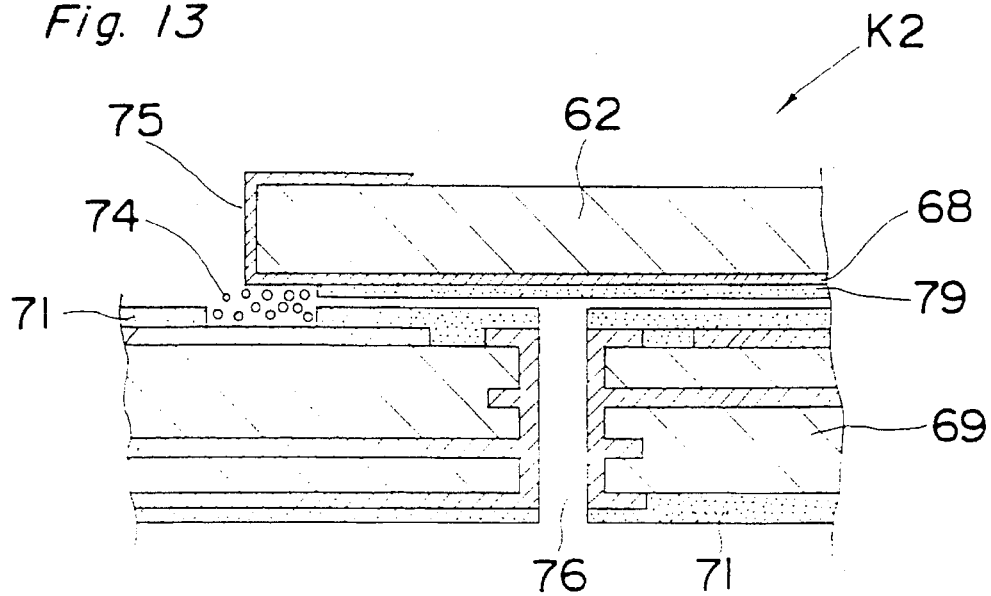
FIG. 13 is a sectional view showing soldering between the dielectric filter of FIG. 10 and a printed circuit board.

As shown in FIG. 13, a printed circuit board 69 at the side of a producer of communication equipment has a known arrangement. In a known manner, filmy input/output terminals 65, 66 and 67 are formed on an upper surface of the base 62 so as to be connected to an antenna, a receiver and a transmitter, respectively. Furthermore, also on a rear surface (mounting surface) of the base 62, the filmy input/output terminals 65–67 are formed so as to be electrically connected to the input/output terminals 65–67 on the upper surface of the base 62. A filmy earth electrode 68 is formed substantially wholly on the rear surface of the base 62. A plurality of through-holes 78 are arranged laterally at a central portion of the base 62 such that the earth electrode 68 is electrically connected to an earth pattern on the upper surface of the base 62 via the through-holes 78.

As shown in FIG. 10, a plurality of earth terminals 75 are formed on a peripheral edge of the base 62 at a predetermined interval. The earth electrodes 75 are formed integrally with the earth electrode 68 and thus, portions of the earth electrode 68 act as the earth terminals 75.

As shown in FIG. 10, resist is applied to a hatched portion so as to form a resist film 79. Namely, the resist film 79 is formed substantially on the entire lower surface (mounting surface) of the base 62 except for the areas where the input/output terminals 65–67 and a plurality of the earth electrodes 75 are located. The resist film 79 is made of organic compound and has a thickness of 10 to 30 μm.

FIGS. 11(a) and 11(b) show the input/output terminal 66 of the dielectric filter K2, which functions as a hot terminal. As shown in FIG. 11(b), the resist film 79 is disposed at a spatial insulating portion between the input/output terminal 66 and the earth electrode 68 to prevent solder from reaching the earth electrode 68 at the time of soldering of the input/output terminal 66. The foregoing description of the input/output terminal 66 applies to the other input/output terminals 65 and 67 in the same manner.

Figure 12A:
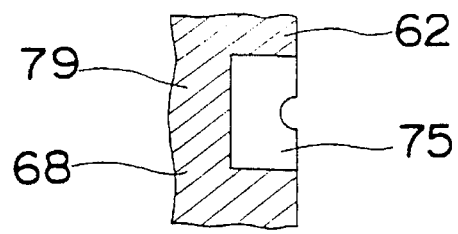
FIGS. 12(a) and 12(b) are an enlarged fragmentary top plan view and an enlarged fragmentary sectional view of an earth terminal portion of the dielectric filter of FIG. 10, respectively.
Figure 12B:
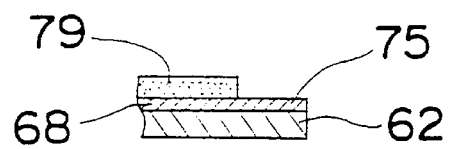

FIGS. 12(a) and 12(b) show the earth electrode 75 of the dielectric filter K2. As shown in FIGS. 12(a) and 12(b), the resist film 79 is formed at a portion of the earth electrode 68 other-than the earth terminals 75. Accordingly, when the earth terminals 75 have been soldered to the base 62, solder is prevented by the resist film 79 from flowing along the earth electrode 68.

Hereinbelow, soldering of the base 62 of the dielectric filter K2 to the printed circuit board 69 at the side of a producer of communication equipment is described. As shown in FIG. 13, the resist film 79 referred to above is formed on the lower surface of the base 62 of the dielectric filter K2 in contrast with known dielectric filters. In FIG. 13, the earth terminal 75 is depicted. Initially, solder cream is applied to soldering portions of the printed circuit board 79 and then, the input/output terminals 65–67 and the earth terminals 75 of the base 62 of the dielectric filter K2 are placed on the solder cream. Subsequently, the base 62 is provisionally secured to the printed circuit board 69. Thus, the above mentioned solder cream in which flux is activated during preheating will spread. However, as shown in FIG. 13, spherical solders 74 flowing along the earth electrode 68 do not become wet relative to the resist film 79 formed on the earth electrode 68 so as to be blocked by the resist film 79 and thus, do not reach interior of the dielectric filter K2. In the same manner as in the foregoing description of the earth terminals 75, the resist film 79 prevents solder from flowing along the earth electrode 68 also in the case of soldering of the input/output terminals 65–67.

Therefore, when the dielectric filter K2 is soldered to the printed circuit board 69 at the side of a producer of communication equipment, solder is prevented from penetrating into the dielectric filter K2. As a result, the possibility of shortcircuiting between the earth electrode 68 and the hot terminals such as the input/output terminals 65–67 is minimized because solder is prevented from flowing to the rear surface of the printed circuit board via through-holes 76 of the printed circuit board 69 at the side of a producer of communication equipment, shortcircuiting of the earth electrode 68 to components on the rear surface of the printed circuit board 69 is eliminated.

If soldering is performed after the resist films have been provided on both of the dielectric filter K2 and the printed circuit board 69 at the side of a producer of communication equipment by providing to a producer of communication equipment a pattern identical to the resist pattern of the resist film 79 the, risk of shortcircuiting caused by solder can be further lessened.

In this embodiment, the dielectric filter K2 includes the cover 63. However, this embodiment can be likewise applied to a dielectric filter having no cover.

In this embodiment, dielectric filter K2 forms the base which includes the circuit components mounted on its upper surface, the input/output terminals and the earth terminals so as to be mounted on the printed circuit board, the input/output terminals and the earth terminals being provided at predetermined locations of the spherical edge portion on the lower surface of the base, respectively, the printed circuit board being formed with the terminals to be connected to the input/output terminals and the earth terminals by soldering, respectively, wherein the resist film is formed at the substantially whole portion of the mounting surface of the base other than the input/output terminals and the earth terminals.

Therefore, when soldering is performed for mounting the dielectric filter K2 on the printed circuit board at the side of a producer of communication equipment, flow of solder is prevented by the resist film. As a result, risk of shortcircuiting between the earth electrode and the hot terminals such as the input/output terminals can be minimized. Furthermore, because most of the mounting face of the dielectric filter K2 is an insulating area of the resist film, risk of shortcircuiting between the earth electrode and the hot lines is eliminated and the degree of freedom in the design of the printed circuit board at the side of a producer of communication equipment is increased.

Figure 14:
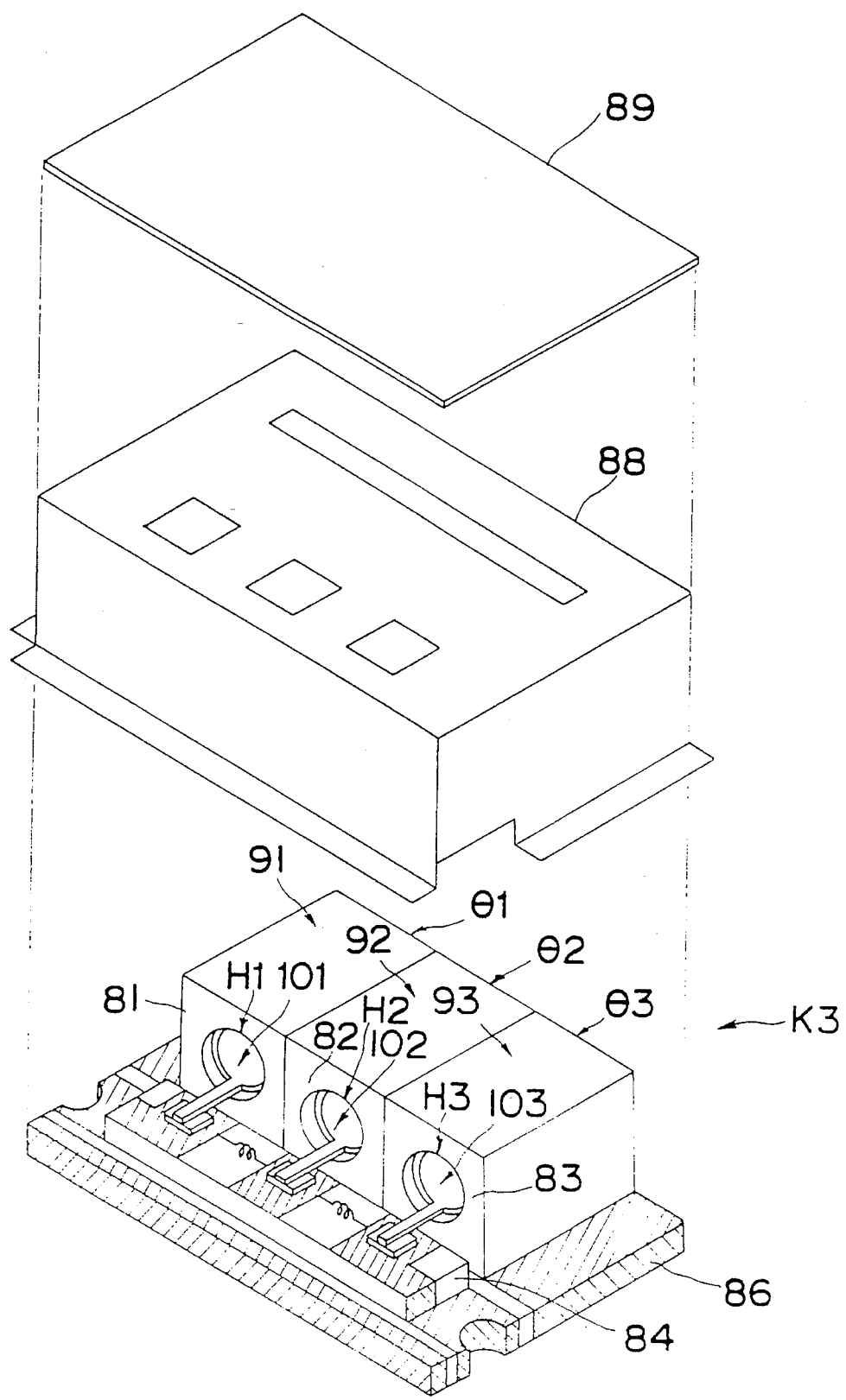
FIG. 14 is an exploded perspective view of a dielectric filter, to which a soldering method for an electronic component, according to one embodiment of another aspect of the present invention is applied.

FIG. 14 shows an electronic component, for example, a dielectric filter K3 to which a soldering method according to one embodiment of another aspect of the present invention may be applied. In FIG. 14, the dielectric filter K3 includes a base substrate 86 on which, for example, three dielectric blocks 81–83 are arranged side by side. Outer conductors 91–93 are formed on outer surfaces of the dielectric filters 81–83, respectively. Through-holes H1–H3 each functioning as a resonator are formed on the dielectric blocks 81–83, respectively. An inner conductor is formed in each of the through-holes H1–H3. Each of the outer conductors 91–93 and the inner conductor are electrically insulated from each other at one end of each of the dielectric blocks 81–83 but are electrically shortcircuited to each other at the other end of each of the dielectric blocks 81–83. A dielectric resonator θ1 is constituted by the dielectric block 81, the outer conductor 91 and the corresponding inner conductor. A dielectric resonator θ2 is constituted by the dielectric block 82, the outer conductor 92 and the corresponding inner conductor. A dielectric resonator θ3 is constituted by the dielectric block 83, the outer conductor 93 and the corresponding inner conductor. Terminals 101–103 are, respectively, press fitted into the through-holes H1–H3 so as to be brought into contact with the corresponding inner conductors.

The dielectric resonators θ1–θ3 are coupled with each other on a coupling substrate 84 so as to constitute the dielectric filter K3 as a whole. A metallic cover 88 is put on the base substrate 86 so as to cover the dielectric resonators θ1–θ3 and the coupling substrate 84. Together with the base substrate 86, the cover 88 constitutes a casing for accommodating the dielectric resonators 74 1–θ3. A shield and a label 89 indicative of an article name are bonded to an upper face of the cover 88.

Figure 15:
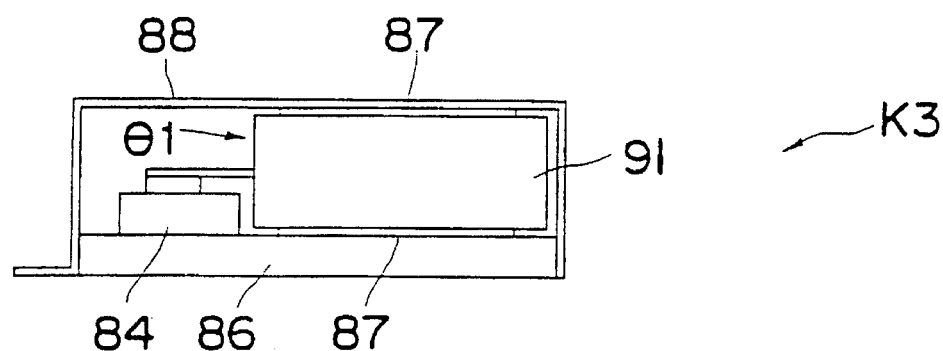
FIG. 15 is a sectional view of the dielectric filter of FIG. 14.

As shown in FIG. 15, the outer conductor 91 of the dielectric resonator θ1 is soldered by solder alloy 87 to an earth electrode formed on the base substrate 86 and an inner surface of the cover 88. The same applies to the outer conductors. 92 and 93 of the dielectric resonators θ2 and θ3. A metal identical with that used for the electronic component to be soldered is added to the solder alloy 87 used for soldering the dielectric resonators θ1–θ3. In case the electronic component to be soldered, for example, the outer conductor 91, the earth electrode and the cover 88 of the dielectric filter K3 are made of copper (Cu), solder alloy containing Cu, i.e. Pb—Sn—Cu is used for soldering.

A phenomenon in which Cu is resorbed by the solder alloy occurs because of the low content of Cu in the solder alloy. Therefore, if Cu is added to the solder alloy as described above, the content of Cu in the solder alloy rises and thus, resorption of Cu forming the electronic component is prevented. Resorption of Cu progresses further as soldering period is lengthened and soldering temperature is raised. However, if the solder alloy containing Cu as described above is used, speed of progress of resorption of Cu can be restricted and thus, maximum values of soldering period and soldering temperature can be increased. Accordingly, in comparison with prior art soldering methods, secure soldering can be performed, thereby resulting in high reliability of the dielectric filter K3.

If the amount of Cu added to the solder alloy is exceedingly large, the solder alloy becomes harder and more fragile and the soldering property of the solder alloy also drops. On the contrary, if the amount of Cu added to the solder alloy is excessively small, resorption cannot be prevented effectively. Hence, the amount of Cu added to the solder alloy should be set to a proper value to prevent the above problems arising in the two extreme cases. Experiments have disclosed that it is proper that the amount of Cu added to the solder alloy is 1.5% by weight. The solder alloy 87 may be either one of filiform solder and creamy solder.

Figure 16A:
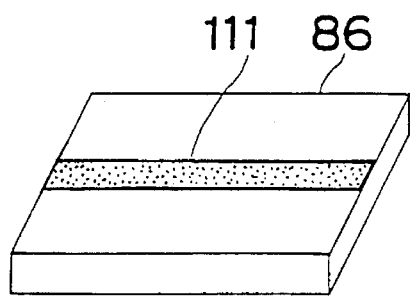
FIGS. 16(a) to 16(c) are views illustrating a solder leveller process performed in a modification of the soldering method of FIG. 14.
Figure 16C:
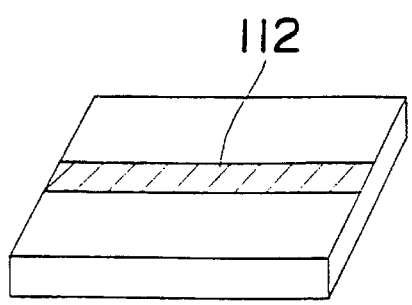
Figure 16B:
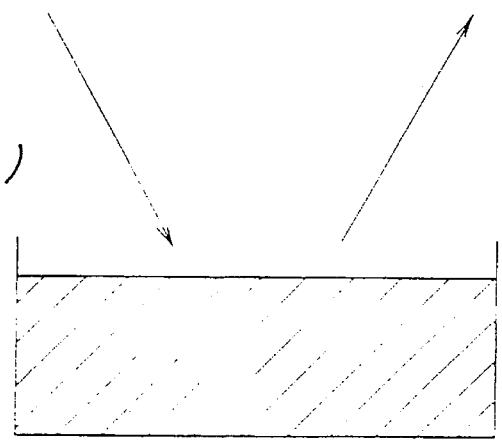

Hereinbelow, a soldering method which is a modification of the solder method of FIG. 14 is described with reference to FIGS. 16(a)–16(c). In the modified soldering method, an electrode 111 such as an earth electrode and an input/output electrode is formed on the base substrate 86 by copper plating, silver plating, etc. as shown in FIG. 16(a). As shown in FIG. 16(c), a solder layer 112 is preliminarily formed on a surface of the electrode 111 by using such techniques as "solder leveller", "solder plating", etc. The technique "solder leveller" referred to above means that the base substrate 86 is dipped through molten solder contained in a tank shown in FIG. 16(b) such that the solder layer 112 is formed on the surface of the electrode 111. The base metal of the base substrate 86 is formed of resin such as glass-epoxy or dielectric. Therefore, at an area on the surface of the base substrate 86 other than the electrode 111, solder is repelled so as not to adhere to the area and thus, the solder layer 112 is not formed. On the other hand, in the technique "solder plating", the solder layer 112 is formed only on the surface of the electrode 111.

In case the solder layer 112 is formed on the electrode 111 prior to a soldering step, affinity of solder is improved and thus, soldering property is upgraded. Because resorption of metal of the electrode by solder can be prevented, the soldering period and soldering temperature can be increased, so that mechanical strength of the soldered portions can be increased, thereby resulting in high reliability of the electronic component. Furthermore, because the solder layer 112 acts as a protective layer to prevent oxidation of the electrode 111, deterioration of the electrode 111 can be prevented.

Figure 17:
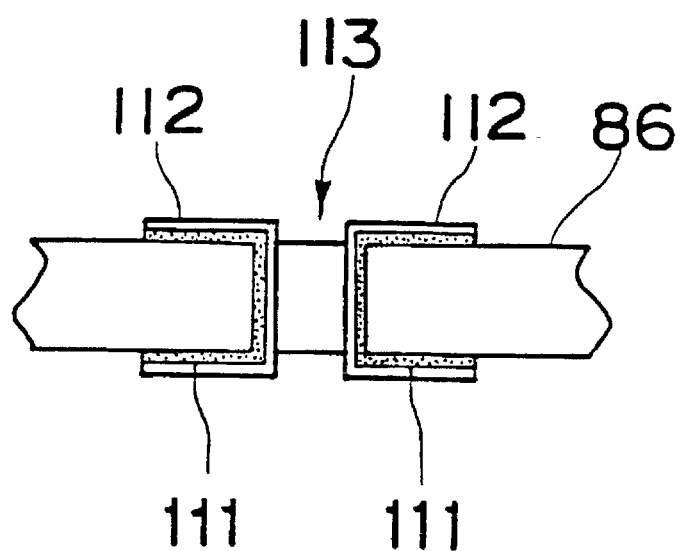
FIG. 17 is a sectional view of a base substrate in which the modified soldering method of FIGS. 16(a) to 16(c) is applied to a through-hole.

In the modified soldering method, it may also be so arranged as shown in FIG. 17 that a through-hole 113 is formed on the base substrate 86 such that the solder layer 111 is formed on the electrode 112 formed on a peripheral surface of the through-hole 113. In this case, mechanical strength of the electrode 111 can be further increased.

In the soldering method of FIG. 14, because soldering is performed by employing solder containing a metal identical with that used for the electronic component, it becomes possible to prevent the metal used for the electronic component from being resorbed by the solder. Therefore, soldering period and soldering temperature are increased and thus, mechanical strength of the soldered portions can be raised, thereby resulting in high reliability of the electronic component.

In the modified soldering method of FIGS. 16(a) to 16(c) and 17, because the solder layer is preliminarily formed at the metal portion of the electronic component and soldering is performed on the solder layer, soldering property of the electronic component is improved and resorption of the metal by solder can be prevented, thus resulting in high reliability of the product. Because the solder layer acts as a protective layer to prevent oxidation of the electronic component, it becomes possible to prevent deterioration of the electronic component.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A high-frequency electronic component comprising:

a base substrate;

at least one electrode located on the base substrate, the at least one electrode including a copper film located on the base substrate, a nickel film located on the copper film and a gold plating film located on the nickel film;

a layer of solder located on the gold plating film;

a high-frequency electronic component element located on the layer of solder such that the layer of solder attaches the high-frequency electronic component element to the gold plating film so that the high-frequency electronic component element is physically mounted on the base substrate and electrically connected to the at least one electrode; wherein the base substrate is made of bismaleimide-triazine resin; and an input/output terminal and an earth terminal provided at predetermined locations on a peripheral edge on a lower surface of the base substrate so as to be connectable to terminals formed on the printed circuit board; and a resist film located on substantially the entire lower surface of the base substrate except for said predetermined locations of the input/output terminal and the earth terminal.

2. A high-frequency electronic component as claimed in claim 1, wherein the base substrate forms a bottom part of a casing for the high-frequency electronic component element.

3. A dielectric filter comprising:

a base which includes a circuit component adapted to be connected to a printed circuit board;

an input/output terminal and an earth terminal provided at predetermined locations on a peripheral edge on a lower surface of the base so as to be connectable to terminals formed on the printed circuit board; and a resist film located on substantially the entire lower surface of the base except for said predetermined locations of the input/output terminal and the earth terminal.

\* \* \* \* \*